United States Patent
Matsumura et al.

(10) Patent No.: US 8,946,983 B2
(45) Date of Patent: Feb. 3, 2015

(54) PHOSPHOR-CONTAINING SHEET, LED LIGHT EMITTING DEVICE USING THE SAME, AND METHOD FOR MANUFACTURING LED

(75) Inventors: Nobuo Matsumura, Otsu (JP); Takejiro Inoue, Otsu (JP); Hironobu Sadakuni, Otsu (JP); Yutake Ishida, Otsu (JP); Kazunari Kawamoto, Otsu (JP); Masahiro Yoshioka, Otsu (JP); Tetsuya Goto, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 14/002,252

(22) PCT Filed: May 14, 2012

(86) PCT No.: PCT/JP2012/062251
§ 371 (c)(1),
(2), (4) Date: Oct. 1, 2013

(87) PCT Pub. No.: WO2012/172901
PCT Pub. Date: Dec. 20, 2012

(65) Prior Publication Data
US 2014/0210338 A1    Jul. 31, 2014

(30) Foreign Application Priority Data
Jun. 16, 2011   (JP) ................. 2011-133955

(51) Int. Cl.
*F21K 99/00*     (2010.01)
*H01L 33/50*     (2010.01)
(Continued)

(52) U.S. Cl.
CPC ............. *F21K 9/56* (2013.01); *H01L 33/502* (2013.01); *C08J 5/18* (2013.01); *C08L 83/04* (2013.01); *H01L 24/83* (2013.01); *F21K 9/90* (2013.01);
(Continued)

(58) Field of Classification Search
USPC ................... 313/498, 501, 511, 512; 156/67; 252/301.36
See application file for complete search history.

(56) References Cited

U.S. PATENT DOCUMENTS 3,944,519 A    3/1976   Mink et al.
4,882,517 A *   11/1989   Maruyama et al. .......... 313/502
(Continued)

FOREIGN PATENT DOCUMENTS

CN    101061589 A    10/2007
CN    101460661 A    12/2007
(Continued)

OTHER PUBLICATIONS

Chinese Office Action dated Mar. 5, 2014, application No. 201280003242.5.
(Continued)

*Primary Examiner* — Tracie Y Green
(74) *Attorney, Agent, or Firm* — RatnerPrestia (57) ABSTRACT

A phosphor-containing sheet having a storage modulus of 0.1 MPa or more at 25° C. and a storage modulus of less than 0.1 MPa at 100° C., wherein a resin main component of the phosphor-containing sheet is a crosslinked product formed by subjecting a crosslinkable silicone composition containing a specific composition to a hydrosilylation reaction. This phosphor-containing sheet provides a phosphor sheet having good shapability and high adhesive power as a phosphor sheet bonded to an LED chip as a wavelength conversion layer.

11 Claims, 3 Drawing Sheets

(51) Int. Cl.
    *C08J 5/18*     (2006.01)
    *C08L 83/04*     (2006.01)
    *H01L 23/00*     (2006.01)
    *C08G 77/04*     (2006.01)
    *C08G 77/12*     (2006.01)
    *C08G 77/20*     (2006.01)
    *C08G 77/00*     (2006.01)

(52) U.S. Cl.
    CPC ...... *H01L 2933/0041* (2013.01); *C08J 2383/07* (2013.01); *C08G 77/045* (2013.01); *C08G 77/12* (2013.01); *C08G 77/20* (2013.01); *C08G 77/80* (2013.01); *H01L 2224/83192* (2013.01)
    USPC .......................... 313/498; 252/301.36; 156/67

(56) References Cited

U.S. PATENT DOCUMENTS

| | | | |
|---|---|---|---|
| 7,511,424 B2 * | 3/2009 | Sofue et al. | 313/512 |
| 8,497,024 B2 * | 7/2013 | Ueno et al. | 428/447 |
| 2008/0185601 A1 | 8/2008 | Frisch et al. | |
| 2008/0308828 A1 | 12/2008 | Kashiwagi et al. | |
| 2009/0118440 A1 | 5/2009 | Nakanishi et al. | |
| 2010/0301377 A1 | 12/2010 | Kato et al. | |
| 2011/0186893 A1 | 8/2011 | Kondo et al. | |
| 2011/0316031 A1 | 12/2011 | Ooyabu et al. | |
| 2014/0057374 A1 | 2/2014 | Kondo et al. | |

FOREIGN PATENT DOCUMENTS

| | | |
|---|---|---|
| CN | 101506309 A | 8/2009 |
| CN | 102315339 A | 1/2012 |
| CN | 102464887 A | 5/2012 |
| EP | 2 355 195 A2 | 8/2011 |
| GB | 814927 | 6/1959 |
| JP | 51-107350 A | 9/1976 |
| JP | 2007-008996 A | 1/2007 |
| JP | 2008/545553 A | 12/2008 |
| JP | 2009-235368 A | 10/2009 |
| JP | 2010-123802 | 6/2010 |
| JP | 2011-102004 | 5/2011 |
| JP | 2012-052035 A | 3/2012 |
| WO | WO 2007/001039 A1 | 6/2006 |
| WO | WO 2006/127100 A1 | 11/2006 |
| WO | WO 2007/140766 | 12/2007 |

OTHER PUBLICATIONS

International Search Report dated Aug. 21, 2012, application No. PCT/JP2012/062251.

Supplementary European Search Report dated Aug. 20, 2014, application No. EP 12 80 0149.

Chinese Office Action dated Apr. 23, 2014, application No. 201280003241.0.

* cited by examiner

PHOSPHOR-CONTAINING SHEET, LED LIGHT EMITTING DEVICE USING THE SAME, AND METHOD FOR MANUFACTURING LED

CROSS REFERENCE TO RELATED APPLICATIONS

This is the U.S. National Phase application of PCT International Application No. PCT/JP2012/062251, filed May 14, 2012, and claims priority to Japanese Patent Application No. 2011-133955, filed Jun. 16, 2011, the disclosures of each of which being incorporated herein by reference in their entireties for all purposes.

FIELD OF THE INVENTION

The present invention relates to a fluorescent material formed into a sheet for converting an emission wavelength of an LED chip.

BACKGROUND OF THE INVENTION

A light emitting diode (LED) is rapidly expanding its market for a backlight of a liquid crystal display (LCD) and for general lighting in addition to lighting in automotive applications such as headlight because of a low power consumption, a long life time and design against the background of significant improvement in luminance efficiency.

An emission color of an LED is limited since an emission spectrum of the LED depends on a semiconductor material for forming an LED chip. Therefore, in order to obtain LCD backlight or white light for general lighting by using an LED, it is necessary that a phosphor suitable for an LED chip is arranged on the LED chip to convert an emission wavelength. Specifically, a method of disposing a yellow phosphor on an LED chip that emits blue light, a method of disposing a red phosphor and a green phosphor on an LED chip that emits blue light, a method of disposing a red phosphor, a green phosphor and a blue phosphor on an LED chip that emits ultraviolet light, and the like are proposed. Among these methods, the method of disposing a yellow phosphor on an LED chip that emits blue light, and the method of disposing a red phosphor and a green phosphor on an LED chip that emits blue light are currently most widely employed from the viewpoints of luminance efficiency and cost of an LED chip.

Patent Documents 1 to 3 propose a method of bonding a sheet containing a phosphor (hereinafter, referred to as a phosphor sheet) to an LED chip as a specific method of disposing a phosphor on an LED chip. This method is superior in that a constant amount of a phosphor can be more easily arranged on an LED chip than a method of dispensing a liquid resin, in which a phosphor heretofore put to practical use is dispersed, on an LED chip and curing the resin, and color and luminance of the resulting white LED can be uniform.

PATENT DOCUMENTS

Patent Document 1: Japanese Patent Laid-open Publication No. 2009-235368
Patent Document 2: Japanese Patent Laid-open Publication No. 2010-123802
Patent Document 3: Japanese Patent Publication No. 2011-102004

SUMMARY OF THE INVENTION

The method of bonding a phosphor sheet to an LED chip is a more excellent method for stabilizing color and luminance than the method of using a liquid resin containing a phosphor as described above but it includes a problem of difficulty of machining. There is a fear that cutting for singulating the phosphor sheet into a size of the LED chip may be cumbersome, and it is necessary to previously perform holing at an area of the phosphor sheet corresponding to an electrode portion on the LED chip. Therefore, it is important to develop a phosphor sheet material having excellent machinability.

On the other hand, it is essential to impart tackiness or adhesiveness in order to bond the phosphor sheet to the LED chip. For example, Patent Document 1 discloses a method in which a sheet material obtained by dispersing a phosphor in an uncured silicone resin is molded, and the molded material is bonded and thermally cured to attain firm adhesion. However, in the disclosed method herein, the phosphor sheet prior to bonding is in an uncured state since if a resin main component contained in the phosphor sheet is a cured silicone resin, the phosphor sheet hardly attains an adhesive property, and it is in the form of a semisolid or flexible solid and therefore the phosphor sheet is very difficult to perform cutting or holing with high precision.

Further, Patent Document 2 employs a double-layered structure of a layer containing a phosphor and a layer not containing a phosphor for securing an adhesive property, and specifies high-temperature (150° C.) elastic modulus in both cases before curing and after curing. By having the double-layered structure, the layers are functionally separated into a layer containing a phosphor in a high concentration and an adhesive layer not containing a phosphor, and an elastic modulus at a high-temperature of each layer is specified and therefore the phosphor sheet has an excellent bonding property, but properties at normal temperature are not identified, and machinability such as holing or cutting before bonding is not considered.

Moreover, Patent Document 3 discloses a composite sheet formed by laminating an inorganic phosphor plate and an adhesive layer and discloses that the inorganic phosphor plate can be cut by dicing, but the adhesive layer is made of a silicone-based elastomer, and machinability of the sheet at room temperature is not clear.

As described above, a phosphor sheet which has excellent machinability prior to bonding and has an excellent adhesive property at the time of bonding has not been attained. The present invention provides a phosphor sheet which achieves these characteristics simultaneously.

The present invention includes a phosphor-containing sheet having a storage modulus of 0.1 MPa or more at 25° C. and a storage modulus of less than 0.1 MPa at 100° C., wherein a resin main component of the phosphor-containing sheet is a crosslinked product formed by subjecting a crosslinkable silicone composition containing at least the following compositions (A) to (D) to a hydrosilylation reaction;

(A) organopolysiloxane represented by an average unit formula:

in which $R^1$ is a phenyl group, an alkyl group or a cycloalkyl group having 1 to 6 carbon atoms, or an alkenyl group having 2 to 6 carbon atoms, provided that 65 to 75 mol % of $R^1$ is phenyl and 10 to 20 mol % of $R^1$ is an alkenyl group, $R^2$ is a hydrogen atom or an alkyl group having 1 to 6 carbon atoms, and a, b and c satisfy the relationship of $0.5 \leq a \leq 0.6$, $0.4 \leq b \leq 0.5$, $0 \leq c \leq 0.1$ and $a+b=1$;

(B) organopolysiloxane (5 to 15 parts by weight with respect to 100 parts by weight of the component (A)) represented by the general formula:

$$R^3{}_3SiO(R^3{}_2SiO)_m SiR^3{}_3$$

in which $R^3$ is a phenyl group, an alkyl group or a cycloalkyl group having 1 to 6 carbon atoms, or an alkenyl group having 2 to 6 carbon atoms, provided that 40 to 70 mol % of $R^3$ is phenyl and at least one of $R^3$s is an alkenyl group, and m is an integer of 5 to 50;

(C) organotrisiloxane (such an amount that a molar ratio of a hydrogen atom coupled with a silicon atom in this component to the total of the alkenyl group in the component (A) and the alkenyl group in the component (B) is 0.5 to 2) represented by the general formula:

$$(HR^4{}_2SiO)_2SiR^4{}_2$$

in which $R^4$ is a phenyl group, or an alkyl group or a cycloalkyl group having 1 to 6 carbon atoms, provided that 30 to 70 mol % of $R^4$ is phenyl; and (D) a catalyst for a hydrosilylation reaction (such an amount enough to promote a hydrosilylation reaction of the alkenyl groups in the component (A) and the component (B) with the hydrogen atom coupled with a silicon atom in the component (C).

In accordance with the present invention, a phosphor-containing resin layer has excellent ability of machining such as cutting and holing since the phosphor-containing resin layer has a high storage modulus at around room temperature. Further, the phosphor-containing resin layer has an excellent adhesive property by being bonded to an LED element at elevated temperatures since it has a low storage modulus at elevated temperatures.

DETAILED DESCRIPTION OF EMBODIMENTS OF THE INVENTION

A silicone resin or an epoxy resin is preferably used for a phosphor-containing sheet (hereinafter, sometimes referred to as a "phosphor sheet" simply) of the present invention principally from the viewpoint of transparency. Furthermore, a silicone resin is particularly preferably used from the viewpoint of heat resistance.

As the silicone resin used in the present invention, a curable silicone rubber is preferred. Any liquid form of a one-component liquid form and two-component liquid form (three-component liquid form) may be employed. A type of the curable silicone rubber includes a type in which a condensation reaction occurs by a moisture in the air or a catalyst, and this type includes a dealcoholization type, a deoximation type, an acetic acid elimination type, and a hydroxyamine elimination type, but an addition cure type in which a hydrosilylation reaction occurs by a catalyst is preferred. Particularly, an addition cure silicone rubber is more preferred in that a by-product associated with a curing reaction is not produced, shrinkage by curing is small, and curing can be easily accelerated by heating.

The addition cure silicone rubber is formed, as an example, by a hydrosilylation reaction of a compound containing an alkenyl group coupled with a silicon atom with a compound containing a hydrogen atom coupled with a silicon atom. In the present invention, characteristics described later can be obtained by using a silicone resin which is a crosslinked product formed by subjecting a crosslinkable silicone composition (hereinafter, the present composition) containing the following compositions (A) to (D) to a hydrosilylation reaction.

The crosslinkable silicone composition is preferably used, which includes at least (A) organopolysiloxane represented by an average unit formula:

$$(R^1{}_2SiO_{2/2})_a(R^1SiO_{3/2})_b(R^2O_{1/2})_c$$

in which $R^1$ is a phenyl group, an alkyl group or a cycloalkyl group having 1 to 6 carbon atoms, or an alkenyl group having 2 to 6 carbon atoms, provided that 65 to 75 mol % of $R^1$ is phenyl and 10 to 20 mol % of $R^1$ is an alkenyl group, $R^2$ is a hydrogen atom or an alkyl group having 1 to 6 carbon atoms, and a, b and c satisfy the relationship of $0.5 \le a \le 0.6$, $0.4 \le b \le 0.5$, $0 \le c \le 0.1$ and $a+b=1$;

(B) organopolysiloxane (5 to 15 parts by weight with respect to 100 parts by weight of the component (A)) represented by the general formula:

$$R^3{}_3SiO(R^3{}_2SiO)_m SiR^3{}_3$$

in which $R^3$ is a phenyl group, an alkyl group or a cycloalkyl group having 1 to 6 carbon atoms, or an alkenyl group having 2 to 6 carbon atoms, provided that 40 to 70 mol % of $R^3$ is phenyl and at least one of $R^3$s is an alkenyl group, and m is an integer of 5 to 50;

(C) organotrisiloxane (such an amount that a molar ratio of a hydrogen atom coupled with a silicon atom in this component to the total of the alkenyl group in the component (A) and the alkenyl group in the component (B) is 0.5 to 2) represented by the general formula:

$$(HR^4{}_2SiO)_2SiR^4{}_2$$

in which $R^4$ is a phenyl group, or an alkyl group or a cycloalkyl group having 1 to 6 carbon atoms, provided that 30 to 70 mol % of $R^4$ is phenyl; and (D) a catalyst for a hydrosilylation reaction (such an amount enough to promote a hydrosilylation reaction of the alkenyl groups in the component (A) and the component (B) with the hydrogen atom coupled with a silicon atom in the component (C).

A silicone resin having the above-mentioned composition is a silicone resin which is useful in implementing the present invention. In the general formula of the component (A), a, b and c are defined so as to fall within a range in which the resulting crosslinked product has sufficient hardness at room temperature and an enough degree of softening to implement the present invention at elevated temperatures. In the general formula of the component (B), when the content of the phenyl group is less than a lower limit of the above range, softening at elevated temperatures of the resulting crosslinked product is insufficient, and on the other hand, when the content of the phenyl group exceeds an upper limit of the above range, transparency of the resulting crosslinked product is lost and mechanical strength of the crosslinked product is deteriorated. Further, in the formula, at least one of $R^3$s is an alkenyl group. The reason for this is that there is a possibility that if this component does not have an alkenyl group, this component is not taken in a crosslinking reaction and is bled out of the resulting crosslinked product. Further, in the formula, m is an integer of 5 to 50, and this is a range within which handling workability is maintained while the mechanical strength of the resulting crosslinked product is maintained.

In the present composition, the content of the component (B) is in a range of 5 to 15 parts by weight with respect to 100 parts by weight of the component (A). This range of the content of the component (B) is a range for achieving adequate softening of the resulting crosslinked product.

In the general formula of the component (C), $R^4$ is a phenyl group, or an alkyl group or a cycloalkyl group having 1 to 6 carbon atoms. Examples of the alkyl group of $R^4$ include a methyl group, an ethyl group, a propyl group, a butyl group, a pentyl group and a heptyl group. Examples of the cycloalkyl group of $R^4$ include a cyclopentyl group and a cycloheptyl group. In addition, the content of the phenyl group of $R^4$ is in a range of 30 to 70 mol %. This range of the content of the phenyl group is a range for achieving adequate softening of the resulting crosslinked product at elevated temperatures and for maintaining transparency and mechanical strength of the resulting crosslinked product.

In the present composition, the content of the component (C) is adjusted to such an amount that a molar ratio of a hydrogen atom coupled with a silicon atom in the component (C) to the total of an alkenyl group in the component (A) and an alkenyl group in the component (B) is 0.5 to 2. This range of the content of the component (C) is a range for achieving adequate hardness at room temperature of the resulting crosslinked product.

The component (D) is a catalyst for a hydrosilylation reaction for promoting a hydrosilylation reaction of alkenyl groups in the component (A) and the component (B) with a hydrogen atom coupled with a silicon atom in the component (C). Examples of the composition (D) include a platinum-based catalyst, a rhodium-based catalyst, and a palladium-based catalyst, and a platinum-based catalyst is preferred since it can significantly promote curing of the present composition. Examples of the platinum-based catalyst include a platinum fine powder, chloroplatinic acid, an alcohol solution of chloroplatinic acid, a platinum-alkenylsiloxane complex, a platinum-olefin complex, and a platinum-carbonyl complex, and a platinum-alkenylsiloxane complex is particularly preferred. Examples of such alkenylsiloxane include 1,3-divinyl-1,1,3,3-tetramethyldisiloxane, 1,3,5,7-tetramethyl-1,3,5,7-tetravinylcyclotetrasiloxane, alkenylsiloxanes formed by substituting an ethyl group, a phenyl group or the like for a part of methyl groups of these alkenylsiloxanes, and alkenylsiloxanes formed by substituting an allyl group, a hexenyl group or the like for a vinyl group of these alkenylsiloxanes. Particularly, 1,3-divinyl-1,1,3,3-tetramethyldisiloxane is preferred since the stability of the complex of this alkenylsiloxane with platinum is good. Further, it is preferred to add alkenylsiloxane such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane and 1,3,5,7-tetramethyl-1,3,5,7-tetravinylcyclotetrasiloxane; or an organosiloxane oligomer such as a dimethylsiloxane oligomer to the complex since the stability of the complex of this alkenylsiloxane with platinum can be improved, and it is particularly preferred to add alkenylsiloxane.

In the present composition, the content of the component (D) is not particularly limited as long as the amount of the component (D) is enough to promote a hydrosilylation reaction of the alkenyl groups in the component (A) and the component (B) with the hydrogen atom coupled with a silicon atom in the component (C), but it is preferably such a content that a metal atom in the component (D) is 0.01 to 500 ppm in the present composition in terms of a mass unit, furthermore preferably 0.01 to 100 ppm, and particularly preferably 0.01 to 50 ppm. This is a range in which the resulting composition is adequately crosslinked and a problem of coloring does not arise.

The present composition includes at least the above-mentioned component (A) to component (D), and may additionally contain, as an optional component, a reaction inhibitor such as alkyne alcohol, for example, ethynylhexanol, 2-methyl-3-butyne-2-ol, 3,5-dimethyl-1-hexyne-3-ol, and 2-phenyl-3-butyne-2-ol; an enyne compound, for example, 3-methyl-3-penten-1-yne and 3,5-dimethyl-3-hexen-1-yne; and 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. The content of the reaction inhibitor is not particularly limited, and it is preferably in a range of 1 to 5000 ppm with respect to the weight of the present composition. The storage modulus of the resulting silicone resin can also be adjusted by adjusting the content of the reaction inhibitor.

It is also possible to add a dispersant or a leveling agent for stabilizing a coating film as an additive, or an adhesion aid such as a silane coupling agent as a modifier of a sheet surface to the phosphor-containing sheet of the present invention. Further, alumina particles, silica particles or silicone particles can be added as an anti-settling agent for a phosphor.

It is advantageous in the present invention that a storage modulus of the phosphor sheet formed by dispersing a phosphor in such a resin is 0.1 MPa or more at 25° C. and is less than 0.1 MPa at 100° C. The storage modulus is more preferably 0.3 MPa or more, more preferably 0.5 MPa or more, furthermore preferably 0.7 MPa or more, and particularly preferably 1.0 MPa or more at 25° C. Also, the storage modulus is more preferably less than 0.07 MPa, more preferably less than 0.05 MPa, furthermore preferably less than 0.03 MPa, and particularly preferably 0.01 MPa at 100° C.

The storage modulus referred to herein is a storage modulus in the case of measuring dynamic viscoelasticity. The dynamic viscoelasticity is a technique in which when shear strain is added to a material at a certain sine frequency, shear stress arising in reaching a steady state is broken down into two components, a component in phase with the shear strain (elastic component) and a component 90° out of phase with the shear strain (viscous component), and a dynamic characteristic of the material is analyzed. Herein, since the component in phase with the shear strain divided by the shear strain is a storage modulus G' and represents deformation or conformity of a material to dynamic strain at each temperature, this is closely related to machinability and an adhesive property of a material.

The phosphor sheet of embodiments of the present invention has machinability with a high dimensional precision because of having a storage modulus of 0.1 MPa or more at 25° C. to thereby allow the sheet to be holed or cut without deformation of a periphery of a machined portion in being subjected to machining such as holing by die punching or cutting with a blade at room temperature (25° C.), in which a fast shear stress is applied. An upper limit of the storage modulus at room temperature is not particularly limited for the object of the present invention, but it is desirably to be 1 GPa or less in consideration of necessity of reducing stress-strain after bonding the phosphor sheet to an LED element. Further, since the storage modulus is less than 0.1 MPa at 100° C., the phosphor sheet is quickly deformed to conform to a surface shape of an LED chip when the phosphor sheet is heated and bonded to the LED chip at a temperature of 60° C.

to 250° C. and thereby a high adhesive power can be attained. When the phosphor sheet has a storage modulus of less than 0.1 MPa at 100° C., the storage modulus is decreased as a temperature is increased from room temperature and a bonding property of the phosphor sheet is made better with increase in temperature even below 100° C., and a temperature is preferably 60° C. or more in order to attain a practical adhesive property. When such a phosphor sheet is heated higher than 100° C., the storage modulus is further decreased, and therefore the bonding property is made better, but at temperatures exceeding 250° C., a problem of thermal expansion/thermal contraction or thermal decomposition of a resin generally tends to occur. Accordingly, a preferred temperature of thermally bonding is 60° C. to 250° C. A lower limit of the storage modulus at 100° C. is not particularly limited for the object of the present invention, but it is desirably to be 0.001 MPa or more since too high flowability at the time of thermally bonding the phosphor sheet to an LED element makes it impossible to maintain a configuration machined by cutting or holing before bonding the sheet.

A resin contained in the phosphor sheet may be uncured or semicured as long as the above-mentioned elastic modulus is attained as the elastic modulus of the phosphor sheet, in consideration of the ability of the sheet to be handled or to be stored as described below, the contained in the phosphor sheet is a cured resin. When the resin is in an uncured state or a semicured state, there is a possibility that a curing reaction may proceed at room temperature during storage of the phosphor sheet and the storage modulus may deviate from a proper range. In order to prevent deterioration of the storage modulus, it is preferred that the resin has been cured or curing of the resin proceeds to such an extent that the storage modulus does not change during a long-term, about one month, upon storage at room temperature.

The phosphor absorbs blue light, violet light, or ultraviolet light emitted from the LED chip, converts their wavelength, and emits light different in wavelength from the light of the LED chip having wavelengths in regions of red, orange, yellow, green and blue. Thereby, a part of light emitted from the LED chip is mixed with a part of light emitted from the phosphor to obtain an LED of multiple color including a white color.

The phosphor described above includes various phosphors such as a phosphor emitting green light, a phosphor emitting blue light, a phosphor emitting yellow light, a phosphor emitting red light and the like. Specific examples of the phosphor used in the present invention include known phosphors such as organic phosphors, inorganic phosphors, fluorescent pigments and fluorescent dyes. Examples of the organic phosphors include allylsulfoamide-melamineformaldehyde co-condensation dyes and perylene phosphors, and perylene phosphors are preferably used since they can be used for the long term. The fluorescent substance particularly preferably used in the present invention includes inorganic phosphors. Hereinafter, the inorganic phosphor used in embodiments of the present invention will be described.

Examples of the phosphor emitting green light include $SrAl_2O_4$:Eu, $Y_2SiO_5$:Ce,Tb, $MgAl_{11}O_{19}$:Ce,Tb, $Sr_7Al_{12}O_{26}$:Eu, and (at least one of Mg, Ca, Sr and Ba)$Ga_2S_4$:Eu.

Examples of the phosphor emitting blue light include $Sr_5(PO_4)_3Cl$:Eu, $(SrCaBa)_5(PO_4)_3Cl$:EU, $(BaCa)_5(PO_4)_3Cl$:EU, (at least one of Mg, Ca, Sr and Ba)$_2B_5O_9Cl$:Eu,Mn, and (at least one of Mg, Ca, Sr and Ba)$(PO_4)_6Cl_2$:Eu,Mn.

Examples of the phosphor emitting green-yellow light include an yttrium-aluminum oxide phosphor activated with at least cerium, an yttrium-gadolinium-aluminum oxide phosphor activated with at least cerium, an yttrium-aluminum-garnet oxide phosphor activated with at least cerium, and an yttrium-gallium-aluminum oxide phosphor activated with at least cerium (so-called YAG-based phosphor). Specifically, $Ln_3M_5O_{12}$:R (Ln is at least one selected from among Y, Gd and La, M includes at least either Al or Ca, and R is a lanthanoid-based phosphor) and $(Y_{1-x}Ga_x)_3(Al_{1-y}Ga_y)_5O_{12}$:R (R is at least one selected from Ce, Tb, Pr, Sm, Eu, Dy and Ho, and 0<Rx<0.5, 0<y<0.5) can be used.

Examples of the phosphor emitting red light include $Y_2O_2S$:Eu, $La_2O_2S$:Eu, $Y_2O_3$:Eu, and $Gd_2O_2S$:Eu.

Further, Examples of a phosphor emitting light compatible with a blue LED which is currently mainstream include YAG-based phosphors such as $Y_3(Al,Ga)_5O_{12}$:Ce, $(Y,Gd)_3Al_5O_{12}$:Ce, $Lu_3Al_5O_{12}$:Ce and $Y_3Al_5O_{12}$:Ce; TAG-based phosphors such as $Tb_3Al_5O_{12}$:Ce; silicate-based phosphors such as (Ba, Sr)$_3SiO_4$:Eu phosphor, $Ca_3Sc_2Si_3O_{12}$:Ce phosphor and (Sr, Ba,Mg)$_2SiO_4$:Eu phosphor; nitride-based phosphors such as $(Ca,Sr)_2Si_5N_8$:Eu, $(Ca,Sr)AlSiN_3$:Eu and $CaSiAlN_3$:Eu; oxynitride-based phosphors such as Cax $(Si,Al)_{12}(O,N)_{16}$:Eu; and $(Ba,Sr,Ca)Si_2O_2N_2$:Eu phosphor, $Ca_8MgSi_4O_{16}Cl_2$:Eu phosphor, $SrAl_2O_4$:Eu, and $Sr_4Al_{14}O_{25}$:Eu.

Among these phosphors, YAG-based phosphors, TAG-based phosphors and silicate-based phosphors are preferably used from the viewpoint of luminance efficiency and luminance.

Known phosphors other than the above phosphors can be used depending on uses or a desired emission color.

A particle size of the phosphor is not particularly limited, bur a particle size in which D50 is 0.05 μm or more is preferred, and a particle size in which D50 is 3 μm or more is more preferred. Further, a particle size in which D50 is 30 μm or less is preferred, and a particle size in which D50 is 20 μm or less is more preferred. Herein, D50 refers to a particle diameter at which the cumulative percent passing from the small particle-size side in a volume based particle size distribution obtained by measuring with a laser diffraction/scattering particle size distribution measurement method reaches 50%. When D50 is within the above-mentioned range, dispersibility of the phosphor in the phosphor sheet is good, and stable emission is achieved.

In the present invention, the content of the phosphor is preferably 53% by weight or more, more preferably 57% by weight or more, and moreover preferably 60% by weight or more of the whole phosphor sheet. By adjusting the content of the phosphor in the phosphor sheet to the above range, light-resistance of the phosphor sheet can be enhanced. In addition, an upper limit of the phosphor content is not particularly limited, but the content is preferably 95% by weight or less, more preferably 90% by weight or less, furthermore preferably 85% by weight or less, and particularly preferably 80% by weight or less of the whole weight of the phosphor sheet from the viewpoint of easiness of preparing a sheet excellent in workability.

The phosphor sheet of the present invention is particularly preferably used for uses of a surface cover of an LED as described later. In this case, since the content of the phosphor in the phosphor sheet is in the above-mentioned range, an LED light emitting device exhibiting excellent performance can be obtained.

The thickness of the phosphor sheet of the present invention is determined by the phosphor content and desired optical characteristics. Since the phosphor content has a limit from the viewpoint of workability as described above, the thickness is preferably 10 μm or more. Further, the phosphor sheet of the present invention is excellent in light-resistance even in a large thickness since the phosphor content is high. On the other hand, the thickness of the phosphor sheet is preferably 1000 µm or less, more preferably 200 µm or less, and moreover preferably 100 µm or less from the viewpoint of improving optical characteristics/heat resistance of the phosphor sheet. When the thickness of the phosphor sheet is 1000 µm or less, light absorption or light scattering by a binder resin can be reduced, and therefore an optically excellent phosphor sheet is attained.

The thickness of the phosphor sheet of the present invention refers to a thickness (average thickness) measured according to JIS K 7130 (1999) "Plastics—Film and sheeting—Determination of thickness by mechanical scanning (A)".

The heat resistance refers to resistance to heat generated in the LED chip. The heat resistance can be evaluated by comparing the luminance at the time when the LED emits light at room temperature with the luminance at the time when the LED emits light at elevated temperatures, and measuring a degree of reduction in luminance at elevated temperatures.

The environment of the LED is an environment in which a large amount of heat is generated in a small space, and particularly in the case of a high power LED, heat generation is remarkable. A temperature of the phosphor is raised by such heat generation and hence the luminance of the LED is reduced. Therefore, it is important how to release the generated heat with efficiency. In the present invention, a sheet having excellent heat resistance can be attained by setting the thickness of a sheet to the above-mentioned range. Further, when the sheet thickness varies, there are differences in the amount of the phosphor among the LED chips, and consequently variations in emission spectrum (color temperature, luminance, chromaticity) are caused. Accordingly, a sheet thickness variation is preferably within a range of plus or minus 5%, and more preferably within a range of plus or minus 3%. In addition, the sheet thickness variation referred to herein is determined by measuring a thickness according to JIS K 7130 (1999) "Plastics—Film and sheeting—Determination of thickness by mechanical scanning (A)", and calculating from the following equation.

More specifically, using measurement conditions of "Determination of thickness by mechanical scanning (A)", a thickness is measured with a commercially available micrometer such as a contact type thickness measurement apparatus, a difference between a maximum value or a minimum value and an average thickness of the resulting thickness is calculated, and a ratio expressed in percentage of the calculated value divided by the average thickness is a thickness variation B (%).

Thickness variation $B(\%)=\{(\text{maximum thickness deviation}^* - \text{average thickness})/\text{average thickness}\} \times 100$

* As a maximum thickness deviation, of the two differences in the thickness between the maximum value and the average value, and between the minimum value and the average value, a larger difference is selected.

An exemplary method for preparing a phosphor sheet of the present invention will be described. In addition, the following description is just an example, and the method for preparing a phosphor sheet is not limited to this. First, a solution in which a phosphor is dispersed in a resin (hereinafter, referred to as a "silicone resin including a phosphor dispersed therein for preparing a sheet") is prepared as a coating solution for forming a phosphor sheet. The silicone resin including a phosphor dispersed therein for preparing a sheet can be prepared by mixing the phosphor and a resin. In the case of using an addition cure silicone resin, since a curing reaction can be initiated at room temperature if a compound containing an alkenyl group coupled with a silicon atom is mixed with a compound containing a hydrogen atom coupled with a silicon atom, a delaying agent for a hydrosilylation reaction such as an acetylene compound can also be further compounded with the silicone resin including a phosphor dispersed therein for preparing a sheet to extend a pot life. It is also possible to mix a dispersant or a leveling agent for stabilizing a coating film as an additive, or an adhesion aid such as a silane coupling agent as a modifier of a sheet surface in the silicone resin including a phosphor dispersed therein for preparing a sheet. Further, it is also possible to mix, as an anti-settling agent, alumina particles, silica particles or silicone particles in the silicone resin including a phosphor dispersed therein for preparing a sheet.

If necessary for making flowability appropriate, a solvent can also be added to form a solution. The solvent is not particularly limited as long as it can adjust the viscosity of a fluent resin. Examples of the solvent include toluene, methyl ethyl ketone, methyl isobutyl ketone, hexane, acetone, terpineol, and the like.

These components are blended so as to have a predetermined composition, and then the resultant is uniformly mixed/dispersed with a mixer/kneader such as a homogenizer, a rotation-revolution mixer, a three roll mill, a ball mill, a planetary ball mill or a beads mill to obtain a silicone resin including a phosphor dispersed therein for preparing a sheet. After mixing/dispersing, or in the process of mixing/dispersing, deaeration is also preferably performed in a vacuum or under a reduced pressure.

Next, the silicone resin including a phosphor dispersed therein for preparing a sheet is applied onto a base material, and dried. The application can be performed by using a reverse roll coater, a blade coater, a slit die coater, a direct gravure coater, an offset gravure coater, a reverse roll coater, a blade coater, a kiss coater, a natural roll coater, an air knife coater, a roll blade coater, a baribar roll blade coater, a two stream coater, a rod coater, a wire bar coater, a coating applicator, a dip coater, a curtain coater, a spin coater, a knife coater or the like. In order to achieve uniformity of the thickness of the phosphor sheet, the silicone resin is preferably applied with a slit die coater. Further, the phosphor sheet of the present invention can also be prepared by using a printing method such as screen printing, gravure printing, planographic printing or the like. When the printing method is employed, screen printing is preferably used.

A sheet can be dried by using a common heating apparatus such as a hot air drier, an infrared drier or the like. A common heating apparatus such as a hot air drier, an infrared drier or the like is used for thermally curing the sheet. In this case, thermally curing is usually performed under the conditions of a temperature 40 to 250° C. and a heating time 1 minute to 5 hours, and preferably under the conditions of a temperature 100° C. to 200° C. and a heating time 2 minutes to 3 hours.

The base material is not particularly limited, and known metal, film, glass, ceramic, paper or the like can be used. Specific examples of the base material include plates or foils of metal such as aluminum (including aluminum alloy), zinc, copper and iron; films of plastics such as cellulose acetate, polyethylene terephthalate (PET), polyethylene, polyester, polyamide, polyimide, polyphenylene sulfide, polystyrene, polypropylene, polycarbonate, polyvinyl acetate and aramid; and paper having the above-mentioned plastics laminated thereon or paper coated with the above-mentioned plastics, paper having the above-mentioned metals laminated thereon or deposited thereon, and plastic films having the above-mentioned metals laminated thereon or deposited thereon. Further, when the base material is a metal plate, the plate surface may be subjected to chrome- or nickel-plating or ceramic treatment. Among them, flexible film-like materials are preferred as the base material from the viewpoint of adhesion in bonding a phosphor-containing resin sheet to the LED element. Further, a film having high strength is preferably used in order to avoid a possibility of breaking in handling the film-like base material. A resin film is preferred from the viewpoint of the above-mentioned required characteristics and economic efficiency, and among resin films, a PET film is preferred from the viewpoints of economic efficiency and handling. When an elevated temperature of 200° C. or more is required in curing a resin or in bonding the phosphor sheet to the LED, a polyimide film is preferred from the viewpoint of heat resistance. The base material may be previously subjected to release treatment of a surface for ease of releasing a sheet.

The thickness of the base material is not particularly limited, but a lower limit is preferably 40 μm or more, and more preferably 60 μm or more. Also, an upper limit is preferably 5000 μm or less, and more preferably 3000 μm or less.

The phosphor sheet of the present invention is bonded to an LED element as a wavelength conversion layer, and used as a light emitting device. In the present invention, when the phosphor sheet is bonded to an LED element, the sheet is preferably bonded under heating. A heating temperature is desirably 60° C. or more and 250° C. or less, and more desirably 60° C. or more and 150° C. or less. By setting the heating temperature to 60° C. or more, resin design for increasing the difference in elastic modulus between room temperature and a bonding temperature is easily made. Further, by setting the heating temperature to 250° C. or less, the accuracy of bonding can be improved since thermal expansion/thermal contraction of the base material and the phosphor sheet can be reduced. Location accuracy of bonding is important particularly when the phosphor sheet is previously subjected to holing and aligned with a predetermined portion on the LED element. It is more favorable to bond the phosphor sheet at a temperature of 150° C. or less in order to improve the accuracy of bonding. Moreover, it is preferred that stress-strain is not produced between the phosphor sheet and the LED element in order to improve the reliability of the LED light emitting device in accordance with the present invention. Therefore, the bonding temperature is maintained at the vicinity of an operational temperature of the LED light emitting device, and preferably within a range of the operational temperature plus or minus 20° C. A temperature of the LED light emitting device is increased to 80 to 130° C. in lighting up. Thus, the bonding temperature is preferably 60° C. or more and 150° C. or less in order to bring the operational temperature close to the bonding temperature. Accordingly, the characteristic of the phosphor sheet designed so that a storage modulus is adequately decreased at 100° C. is important.

In a method of bonding the phosphor sheet, an existing arbitrary apparatus can be used as long as the apparatus can perform heating and pressurizing at desired temperatures. As described later, the method of bonding the phosphor sheet includes a method in which the phosphor sheet is cut into singulated pieces, and then bonded to a separate LED, and a method in which the phosphor sheet is collectively bonded to a wafer provided with an undiced LED element, and dicing of the wafer and cutting of the phosphor sheet are collectively performed, and in the case of dividing the phosphor sheet into singulated pieces and then bonding the singulated pieces, a flip chip bonder can be employed. The phosphor sheet is bonded with a thermocompression bonding tool having a heating area of about 100 mm square in collectively bonding the sheet to an LED element of a wafer level. In any of these cases, after the phosphor sheet is melted and attached to the LED element at elevated temperatures by heating, the phosphor sheet is left standing to be cooled to room temperature, and the base material is peeled. By having a relationship between a temperature and an elastic modulus like the present invention, the phosphor sheet, which has been left standing and cooled to room temperature after thermal fusion bonding, is allowed to be peeled off easily from the base material while firmly keeping the phosphor sheet in absolute contact with the LED element.

A method of cutting the phosphor sheet will be described. The method of cutting the phosphor sheet includes a method in which the phosphor sheet is previously cut into singulated pieces prior to bonding to an LED element, and then bonded to a separate LED, and a method in which the phosphor sheet is bonded to an LED element of a wafer level, and cut concurrently with dicing of the wafer. In the case where the phosphor sheet is previously cut prior to bonding of the sheet, a phosphor sheet uniformly formed is machined into a predetermined shape by laser beam machining or cutting by a blade, and the machined phosphor sheet is divided. The laser beam machining is very hard to avoid scorch of a resin or degradation of a phosphor due to high energy added, and therefore cutting by a blade is desirable. In order to improve machinability in cutting with a blade, it is very important that a storage modulus at 25° C. of the phosphor sheet is 0.1 MPa or more. A method of cutting with a blade includes a simple method of pushing a blade in an object, and a method of cutting with a rotary blade, and both of them can be suitably used. As an apparatus for cutting with a rotary blade, an apparatus referred to as a dicer, which is used for cutting (dicing) a semiconductor substrate into separate chips, can be suitably utilized. When the dicer is used, a higher machining accuracy can be achieved than cutting by simple pushing in of a blade since a width of a dividing line can be precisely controlled by a thickness of the rotary blade or setting of conditions.

Figure 1:
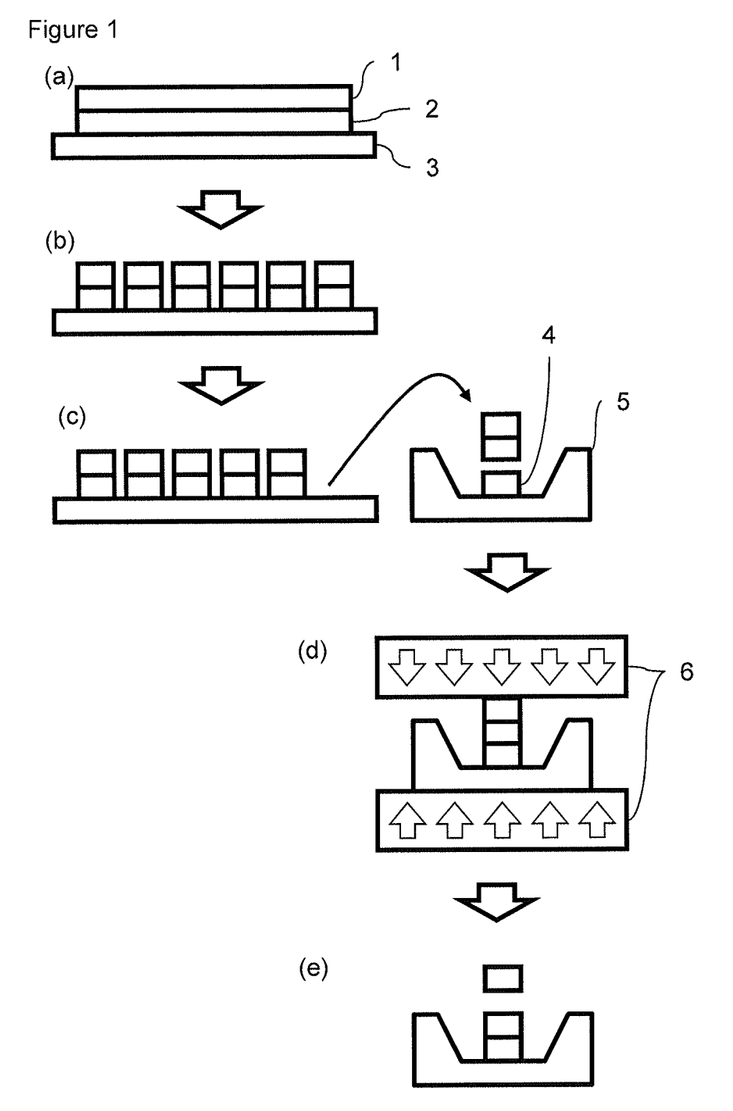
FIG. 1 shows a first example of a manufacturing process of an LED light emitting device with a resin laminated sheet of an embodiment of the present invention.

When the phosphor sheet which is laminated on the base material is cut, the phosphor sheet may be singulated together with the base material, or the base material may not be cut while the phosphor sheet may be singulated. Alternatively, the base material may be subjected to the so-called half-cut in which a cut in not penetrating is made. The phosphor sheet thus singulated is melted and attached to a separate LED chip by heating. An example of the steps of singulation/bonding of an LED element/dicing in the case where the phosphor sheet is singulated with the base material is shown in FIG. 1. The step shown in FIG. 1 includes the step of cutting the phosphor sheet into singulated pieces, and the step of bonding the phosphor-containing sheet cut into singulated pieces to an LED element by heating. FIG. 1(a) is a view showing a state in which the phosphor sheet 1 laminated on a base material 2 is fixed to a temporary fixing sheet 3. In the step shown in FIG. 1, since both of the phosphor sheet 1 and the base material 2 are singulated, the phosphor sheet 1 is fixed to the temporary fixing sheet 3 in order to handle easily. Next, as shown in FIG. 1(b), the phosphor sheet 1 and the base material 2 are cut into singulated pieces. Subsequently, as shown in FIG. 1(c), the phosphor sheet 1 and the base material 2, respectively singulated, are aligned on an LED element 4 mounted on a mounting substrate 5 and press-bonded with a thermocompression bonding tool, as shown in FIG. 1(d). In this time, press-bonding is preferably performed in a vacuum or under a reduced pressure in order to prevent air from being involved between the phosphor sheet 1 and the LED element 4. After press-bonding, the phosphor sheet 1 is left standing to be cooled to room temperature, and the base material 2 is peeled as shown in FIG. 1(*e*).

Figure 2:
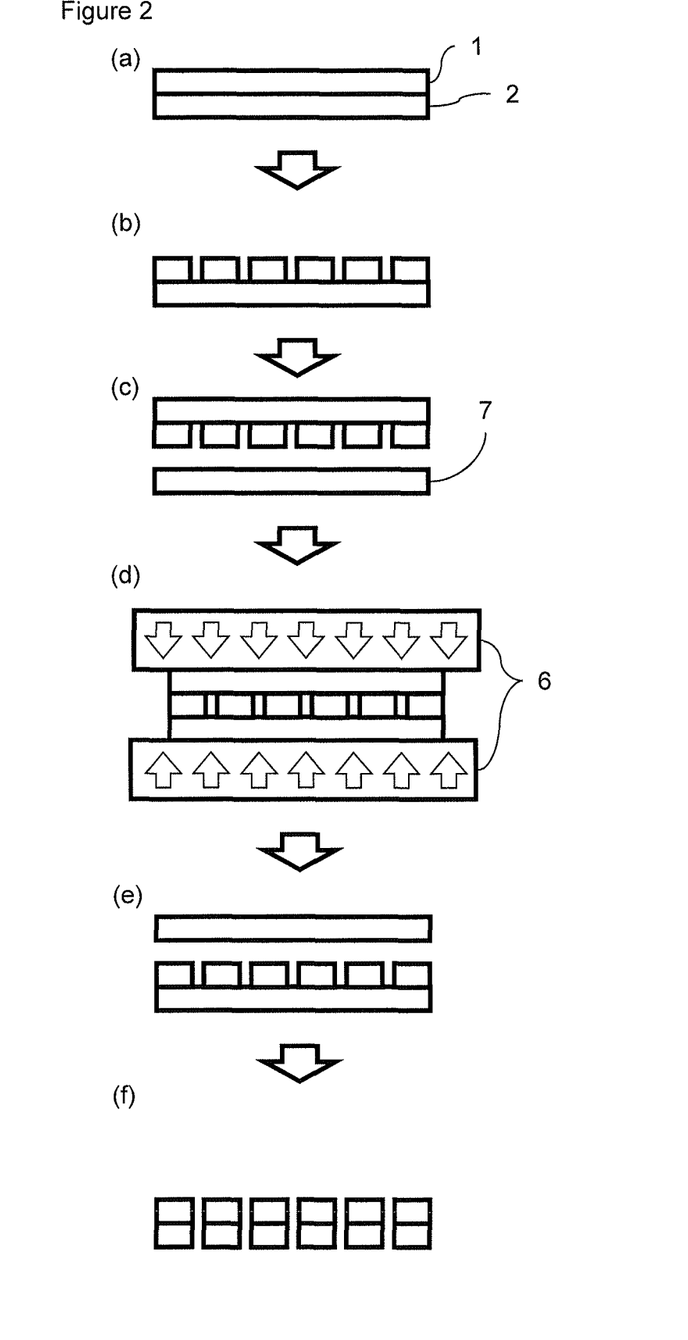
FIG. 2 shows a second example of a manufacturing process of an LED light emitting device with a resin laminated sheet of an embodiment of the present invention.

Further, when the phosphor sheet is singulated leaving the base material in a continuous state, singulated phosphor sheets may be melted and attached collectively to an undiced LED element of a wafer level as-is. An example of the steps of singulation/bonding of an LED element/dicing in the case where the phosphor sheet is singulated leaving the base material in a continuous state is shown in FIG. 2. The step shown in FIG. 2 also includes the step of cutting the phosphor sheet into singulated pieces, and the step of bonding the phosphor-containing sheet cut into singulated pieces to an LED element by heating. In an example of the step shown in FIG. 2, the base material 2 is not singulated in singulating the phosphor sheet 1 first in the step shown in FIG. 2(*b*). In FIG. 2(*b*), the base material 2 is not cut at all, but the base material 2 may be partially cut as long as it is continued. Next, as shown in FIG. 2(*c*), the singulated phosphor sheet 1 is opposed to a wafer 7 provided with an undiced LED element on the surface thereof, and aligned with the wafer 7. In the step shown in FIG. 2(*d*), the phosphor sheet 1 is press-bonded to the wafer 7 provided with an undiced LED element on the surface thereof by using a thermocompression bonding tool. In this time, press-bonding is preferably performed in a vacuum or under a reduced pressure in order to prevent air from being involved between the phosphor sheet 1 and the LED element 4. After press-bonding, the phosphor sheet 1 is left standing to be cooled to room temperature, and the base material 2 is peeled as shown in FIG. 2(*e*), and then the wafer is diced to be singulated to obtain an LED element with the singulated phosphor sheet, as shown in FIG. 2(*f*).

Figure 3:
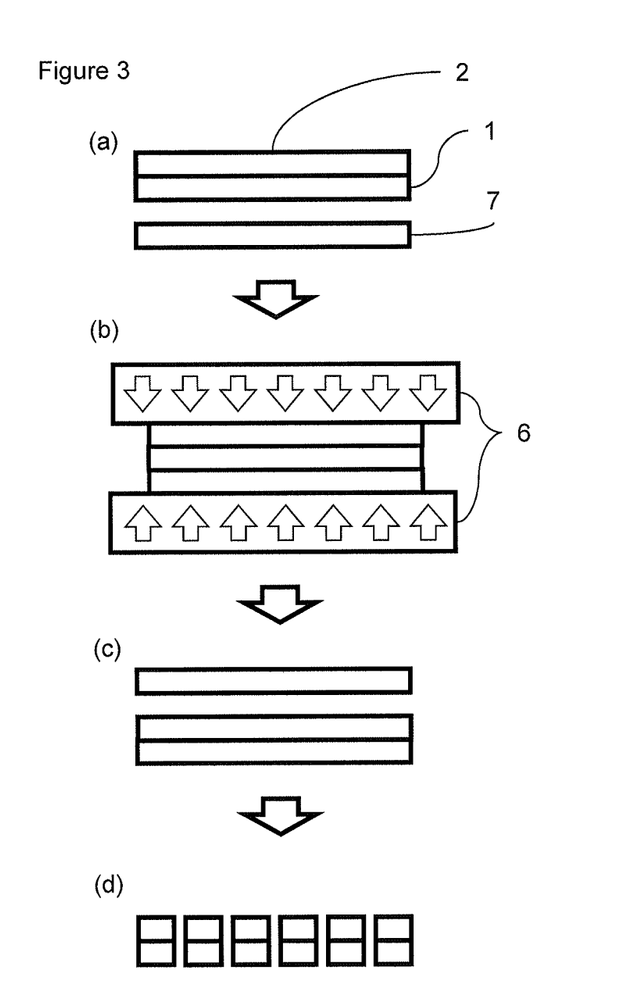
FIG. 3 shows a third example of a manufacturing process of an LED light emitting device with a resin laminated sheet of an embodiment of the present invention.

When the singulated phosphor sheet is melted and attached collectively to an undiced LED element of a wafer level by heating, the phosphor sheet may be cut together with dicing of the LED element wafer after bonding. Since dicing of the wafer is carried out by the above-mentioned dicer and conditions such as number of rotations or cutting speed at the time of cutting is set to optimum conditions of cutting a semiconductor wafer, it is difficult to set the conditions at the time of cutting to optimum conditions to cut the phosphor sheet, but the phosphor sheet can be suitably cut by using the phosphor sheet having a high elastic modulus at 25° C. as specified by the present invention. An example of the step in the case where the phosphor sheet and the wafer are collectively diced after bonding the phosphor sheet to the wafer is shown in FIG. 3. The step shown in FIG. 3 includes the step of bonding the phosphor sheet to a plurality of LED elements collectively by heating, and the step of collectively dicing the phosphor sheet and the LED element. In the step of FIG. 3, the phosphor sheet 1 is not previously cut, and aligned with a wafer 7 provided with an undiced LED element on the surface thereof with the side of the phosphor sheet 1 opposed to the wafer 7 as shown in FIG. 3(*a*). Then, as shown in FIG. 3(*b*), the phosphor sheet 1 is press-bonded to the wafer 7 provided with an undiced LED element on the surface thereof by using a thermocompression bonding tool. In this time, press-bonding is preferably performed in a vacuum or under a reduced pressure in order to prevent air from being involved between the phosphor sheet 1 and the LED element 4. After press-bonding, the phosphor sheet 1 is left standing to be cooled to room temperature, and the base material 2 is peeled as shown in FIG. 3(*c*), and then the wafer is diced and at the same time the phosphor sheet 1 is cut to be singulated to obtain an LED element with the singulated phosphor sheet, as shown in FIG. 3(*d*).

In any of cases where one of the steps in FIGS. 1 to 3 described above is employed, when the phosphor sheet of the present invention is bonded to an LED element having an electrode thereon, it is desirable to previously perform holing (form a through-hole) at an area of the phosphor sheet above the electrode in order to eliminate the area of the phosphor sheet before bonding the phosphor sheet. Known methods such as laser beam machining, die punching and the like can be suitably used for holing, but punching by a die is more desirable since the laser beam machining causes scorch of a resin or degradation of a phosphor. When punching is performed, it is essential to perform punching prior to bonding of the phosphor sheet since punching cannot be performed after bonding the phosphor sheet to the LED element. In punching by a die, a hole of an arbitrary shape and an arbitrary size can be made depending on a configuration of an electrode of the LED element to which the phosphor sheet is bonded. The size and the shape of a hole can be arbitrary if a die is designed, but since a size of an electrode connecting portion on the LED element of around 1 mm square is preferably 500 μm or less in order to avoid a reduction in an area of an emission surface, and the hole is formed in a diameter of 500 μm or less in conformity to the size of the electrode connecting portion. Further, since the electrode is to be subjected to wire bonding requires a certain size and this size is at least about 50 μm, a size of the hole is about 50 μm in conformity to the size. When the size of the hole is too larger than that of the electrode, the emission surface is exposed to cause light leakage, and therefore color characteristics of an LED light emitting device are deteriorated. Further, when the size of the hole is too smaller than that of the electrode, a wire is brought into contact with the hole during wire bonding to cause defective connection. Accordingly, it is necessary to machine a hole which is as small as 50 μm or more and 500 μm or less with high precision within plus or minus 10% in holing, and therefore it is very important for improving the precision of punching that a storage modulus of the phosphor sheet at 25° C. is 0.1 MPa or more.

When the phosphor sheet having undergone cutting and holing is aligned with a predetermined portion of the LED element and is bonded to the LED element, a bonder having an optical alignment mechanism is required. In this time, it is difficult due to the nature of the operation to align the phosphor sheet with the LED element in a state of being closely-situated, and it is practically often to align the phosphor sheet with the LED element with the phosphor sheet slightly contacting the LED element. In this time, if the phosphor sheet has tackiness, it is very difficult to move the phosphor sheet in a state of being in contact with the LED element. In accordance with the phosphor sheet of the present invention, it is easy to align the phosphor sheet with the LED element with the phosphor sheet slightly contacting the LED element since the phosphor sheet does not have tackiness when alignment is performed at room temperature.

In lighting equipment using the LED element including the phosphor sheet obtained according to the present invention bonded thereto, color variation and luminance variation are very small since the phosphor sheet exactly machined is provided on the LED element and therefore a constant phosphor exists on the LED element in comparison with the conventional methods based on dispensing of a liquid phosphor-containing resin or a known phosphor sheet. In the method based on dispensing of a liquid phosphor-containing resin, since a shape of the phosphor sheet depends on a surface tension of the liquid resin supplied, it is difficult to form a uniform thickness. Further, in accordance with the phosphor sheet based on design of an elastic modulus range according to the present invention, it becomes possible to reduce the thickness of the phosphor sheet since the phosphor sheet can be machined with high precision compared with conventional phosphor sheets even when the phosphor is loaded at high concentrations. Specifically, according to embodiments of the present invention, a light emitting device obtained by disposing, on the LED element, a phosphor-containing layer having a thickness of 10 to 1000 μm, in which a difference between the thickness at a center and the thickness at a middle point of a line segment drawn from the center to an arbitrary point at an end of the emission surface is preferably within a range of the thickness at the center plus or minus 5% and more preferably within a range of the thickness plus or minus 3%, is manufactured. Herein, the center on the LED element refers to a point of intersection of two diagonal lines since an LED element emission surface is rectangular, and a middle point of a line segment drawn from the center to an end of the emission surface is taken as a middle point between the center and the end. In the present invention, the difference in thickness between the arbitrary middle point and the center can fall within a range of plus or minus 5%. More preferably, the difference in thickness can fall within a range of plus or minus 3%.

EXAMPLES

Hereinafter, the present invention will be described in more detail by way of examples. However, the present invention is not limited to these examples.

<Silicone Resin>
Components for Compounding a Silicone Resin
Resin Main Component $(MeViSiO_{2/2})_{0.25}(Ph_2SiO_{2/2})_{0.3}(PhSiO_{3/2})_{0.45}(HO_{1/2})_{0.03}$ (average composition, corresponding the composition (A))
Cure modifier $ViMe_2SiO(MePhSiO)_{17.5}SiMe_2Vi$ (average composition, corresponding the composition (B))
Crosslinking agent $(HMe_2SiO)_2SiPh_2$ (corresponding the composition (C))
* Me: methyl group, Vi: vinyl group, ph: phenyl group
Reaction inhibitor 1-ethynylhexanol
Platinum catalyst:
1,3-divinyl-1,1,3,3-tetramethyldisiloxane solution of platinum-1,3-divinyl-1,1,3,3-tetramethyldisiloxane complex platinum content 5% by weight
A silicone resin 1 and a silicone resin 2 used in examples were prepared by compounding the above-mentioned components for compounding a silicone resin so as to correspond to "the present composition" in the present specification, and commercialized products were used for silicone resins 3 and 4 used in examples.

Silicone Resin 1
resin main component 75 parts by weight, cure modifier 10 parts by weight, crosslinking agent 25 parts by weight, reaction inhibitor 0.025 parts by weight, platinum catalyst 0.01 parts by weight Silicone Resin 2
resin main component 75 parts by weight, cure modifier 10 parts by weight, crosslinking agent 25 parts by weight, reaction inhibitor 0.05 parts by weight, platinum catalyst 0.01 parts by weight Silicone Resin 3
X-32-2528 (manufactured by Shin-Etsu Chemical Co., Ltd.)

Silicone Resin 4
KER 6075 (manufactured by Shin-Etsu Chemical Co., Ltd.)

<Dynamic Elastic Modulus Measurement>
Measurement apparatus: Viscoelasticity measurement apparatus ARES-G2 (manufactured by TA Instruments Japan Inc.)
Geometry: parallel circular disc (15 mm)
Distortion: 1%
Angular frequency: 1 Hz
Temperature range: 25° C. to 140° C.
Temperature-rising rate: 5° C./min
Measurement atmosphere: in the air
<Preparation of Measurement Sample for Measuring Dynamic Viscoelasticity>
A resin liquid for a phosphor sheet obtained by mixing 30 parts by weight of each of the silicone resins 1 to 4 and 70 parts by weight of a phosphor "NYAG-02" (manufactured by Intematix Corporation: YAG-based phosphor doped with Ce, specific gravity: 4.8 g/cm$^3$, D50: 7 μm) was applied to "Cerapeel" BLK (manufactured by Toray Advanced Film Co., Ltd.) as a base material with a slit die coater to form a film having a thickness of 100 μm. This operation was carried out for each of the silicone resins 1 to 4. The silicone resins 1, 2 and 4 were heated at a film forming temperature of 120° C. for 1 hour, and the silicone resin 3 was heated at 120° C. for 10 minutes since the silicone resin 3 was a silicone adhesive to be used in a semicured state.

Eight sheets of the resulting films having a thickness of 100 μm were laminated, and thermocompression bonded to one another on a hot plate heated to 100° C. to prepare an integrated film (sheet) of 800 μm in thickness, and the sheet was cut out into measurement samples of 15 mm in diameter.

Storage moduli of the samples (containing 70% by weight of the phosphor) at room temperature (25° C.), 100° C. and 140° C. were shown in Table 1.

<Adhesive Property Test>
When a phosphor sheet laminated on a base material was bonded to an LED element at 100° C., press-bonded for a predetermined time and then cooled to room temperature, and the base material was peeled, the least press-bonding time in which the phosphor sheet entirely adhered to the LED element and was not left on the base material was taken as the least time to enable bonding. The phosphor sheet which entirely adhered to the LED element and was not left on the base material in a time of press-bonding by heating of 1 minute or less was rated as good adhesive property, and the phosphor sheet which did not adhere to the LED element, or partially adhered to the LED element but was partially left on the base material even though press-bonding by heating for 1 minute or more was conducted was rated as defective adhesive property.

Example 1

Using a 300 ml polyethylene container, 30% by weight of the silicone resin 1 and 70% by weight of a phosphor "NYAG-02" (manufactured by Intematix Corporation: YAG-based phosphor doped with Ce, specific gravity: 4.8 g/cm$^3$, D50: 7 μm) were mixed.

Thereafter, the resulting mixture was stirred and deaerated at 1000 rpm for 20 minutes by using a planetary mixer/deaerator "MAZERUSTAR KK-400" (manufactured by KURABO INDUSTRIES LTD.) to obtain a silicone resin including a phosphor dispersed therein for preparing a sheet. The silicone resin including a phosphor dispersed for preparing a sheet was applied onto "Cerapeel" BLK (manufactured by Toray Advanced Film Co., Ltd.) as a base material by use of a slit die coater, heated at 120° C. for 1 hour, and dried to obtain a phosphor sheet having a thickness of 90 μm and a size of 100 mm square. Thereafter, a hole of 200 μm in diameter was punched in the phosphor sheet by using a die punching apparatus (manufactured by UHT CORPORATION). Diameters of 10 punched holes were investigated with a microscope equipped with a length measurement device to determine an average of the diameters, and consequently holes almost according to a design value were obtained as shown in Table 2. Then, the phosphor sheet was singulated into 10000 pieces having a size of 1 mm square by using a cutting apparatus (GCUT manufactured by UHT CORPORATION). Both of the phosphor sheet and the base material were cut and completely singulated. A cutting plane did not leave burrs and cracks and had a good shape, and re-bonding of a cut portion did not take place. One hundred pieces were randomly selected from 10000 pieces singulated, and the number of pieces in which a state of a cutting portion was good was counted to evaluate cutting characteristics.

The phosphor sheet cut into a size of 1 mm square was located in such a way that a phosphor sheet surface was in contact with a chip surface of a blue LED chip mounted on a substrate. A hole of the phosphor sheet was aligned on a surface electrode of the LED chip by using a die bonder (manufactured by Toray Engineering Co., Ltd.), and the phosphor sheet was pressed from a base material side by a heating head heated to 100° C., and consequently the least time to enable bonding was 10 seconds. A sample press-bonded for 10 seconds was cooled to room temperature, and then the base material was peeled, and consequently the phosphor sheet completely adhered to the blue LED, and the base material could be cleanly peeled off without leaving the phosphor sheet on the base material, and therefore an adhesive property was good. The surface electrode of the LED chip was subject to wire bonding, and consequently the electrode could be connected through the hole previously machined in the phosphor sheet without any difficulty. The same 10 LEDs provided with a phosphor sheet and sealed with a transparent resin were prepared, and each LED was connected to a DC power source to light up, and consequently it was verified that all of 10 LEDs lit up. Correlated color temperatures (CCT) of all of 10 samples were measured with a chromo illuminance meter (Konica Minolta CL200A), and a difference between the maximum value and the minimum value of the CCT was taken as a color temperature variation and evaluated.

An LED element with a phosphor sheet prepared in a similar way was cut, and SEM of a cross section was measured, and with respect to 10 samples, a difference between the thickness at a center of an LED element emission surface and the thickness at a middle point of a line segment between the above center and an end of the emission surface was measured to determine a difference in thickness between these two points. A ratio of the difference in thickness to the thickness at a center is taken as a difference (%) in thickness of the sample, and an average of the differences in thickness of the 10 samples was calculated. The calculated average was shown as a variation in Table 2. In addition, a negative average shows that the thickness at the above middle point is larger than the thickness at the center.

Example 2

A phosphor sheet was obtained in the same manner as in Example 1 by using the silicone resin 2 in place of the silicone resin 1. A hole of 200 μm in diameter was punched in the phosphor sheet in the same manner as in Example 1, and the phosphor sheet was singulated into a size of 1 mm square. Holing characteristics and cutting characteristics were good as with Example 1. A phosphor sheet cut into a size of 1 mm square in the same manner as in Example 1 was bonded to an LED element, and consequently the least time to enable bonding was 5 seconds. Further, a LED lighting test and a thickness of the phosphor sheet were evaluated in the same manner as in Example 1, and the results were shown in Table 2.

Example 3

A phosphor sheet was obtained in the same manner as in Example 1 by using the silicone resin 2 in place of the silicone resin 1. A hole of 200 μm in diameter was punched in the phosphor sheet in the same manner as in Example 1, and consequently holing characteristics were good. Then, the phosphor sheet was singulated into a size of 1 mm square by using a cutting apparatus (GOUT manufactured by UHT CORPORATION). In this time, the base material was half-cut to remain in a continuous state while completely singulating the phosphor sheet. A cutting plane of the phosphor sheet did not leave burrs and cracks and had a good shape, and re-bonding of a cut portion did not take place.

A phosphor sheet of 100 mm square in which the phosphor sheet was singulated into a size of 1 mm square and the base material was monolithic was located in such a way that a phosphor sheet surface was in contact with the surface of a 4-inch wafer not diced into singulated pieces and including a blue LED element formed on the surface thereof. The singulated phosphor sheet was conformed to each LED element, and a machined hole of the phosphor sheet was aligned on a surface electrode of the LED chip, and the phosphor sheet was press-bonded from a base material side by a heating head heated to 100° C., and consequently the least time to enable bonding was 15 seconds. A sample press-bonded for 15 seconds was cooled to room temperature, and then the base material was peeled, and consequently the phosphor sheet completely adhered to the blue LED, and the base material could be cleanly peeled off without leaving the phosphor sheet on the base material, and therefore an adhesive property was good.

Then, the wafer of the blue LED element was diced with a dicing apparatus (manufactured by DISCO Corporation) to be singulated, and the surface electrode of the singulated LED chip was subject to wire bonding, and consequently the electrode could be connected through the hole previously machined in the phosphor sheet without any difficulty. The same 10 LEDs provided with a phosphor sheet and sealed with a transparent resin were prepared, and each LED was connected to a DC power source to light up, and consequently it was verified that all of 10 LEDs lit up. Correlated color temperatures (CCT) of 10 samples were measured with a chromo illuminance meter (Konica Minolta CL200A), and a difference between the maximum value and the minimum value of the CCT was evaluated. Further, a thickness of the phosphor sheet was evaluated in the same manner as in Example 1, and the results were shown in Table 2.

Example 4

A phosphor-sheet was obtained in the same manner as in Example 1 by using the silicone resin 1. A hole of 200 μm in diameter was punched in the phosphor sheet in the same manner as in Example 1, and consequently holing characteristics were good. A phosphor sheet of 100 mm square was located in such a way that a phosphor sheet surface was in contact with the surface of a 4-inch wafer not diced into singulated pieces and including a blue LED element formed on the surface thereof. A hole of the phosphor sheet was aligned on a surface electrode of the LED chip, and the phosphor sheet was press-bonded from a base material side by a heating head heated to 100° C., and consequently the least time to enable bonding was 10 seconds. A sample press-bonded for 10 seconds was cooled to room temperature, and then the base material was peeled, and consequently the phosphor sheet completely adhered to the blue LED, and the base material could be cleanly peeled off without leaving the phosphor sheet on the base material, and therefore an adhesive property was good.

Then, the wafer of the blue LED element was diced together with the phosphor sheet from a wafer backside (side opposite to a side to which the phosphor sheet was bonded) with a dicing apparatus (manufactured by DISCO Corporation). A cutting plane did not leave burrs and cracks and had a good shape, and re-bonding of a cut portion did not take place.

The surface electrode of the LED chip was subjected to wire bonding, and consequently the electrode could be connected through the hole previously machined in the phosphor sheet without any difficulty. The same 10 LEDs provided with a phosphor sheet and sealed with a transparent resin were prepared, and each LED was connected to a DC power source to light up, and consequently it was verified that all of 10 LEDs lit up. Correlated color temperatures (CCT) of 10 samples were measured with a chromo illuminance meter (Konica Minolta CL200A), and a difference between the maximum value and the minimum value of the CCT was evaluated. Further, a thickness of the phosphor sheet was evaluated in the same manner as in Example 1, and the results were shown in Table 2.

Comparative Example 1

The silicone resin 2 was used in place of the silicone resin 1 to prepare a phosphor-containing silicone resin for preparing a sheet, and the phosphor-containing silicone resin for preparing a sheet was applied onto "Cerapeel" BLK (manufactured by Toray Advanced Film Co., Ltd.) as a base material, heated at 120° C. for 10 minutes, and dried to obtain a phosphor sheet having a thickness of 90 μm and a size of 100 mm square. A hole of 200 μm in diameter was punched in the phosphor sheet in the same manner as in Example 1, and consequently the silicone resin 2 had a so low elastic modulus at room temperature as to exhibit an adherence property, and therefore it adhered to a die, and this made an average value of hole diameters after machining the phosphor sheet significantly smaller than a design value. The phosphor sheet was singulated in the same manner as in Example 1, but about one half of the phosphor sheets was re-bonded and could not be cut off.

Using only phosphor sheets which could be singulated without any difficulty, the phosphor sheet was thermocompression bonded to a blue LED element at 100° C. for 10 seconds by using the same die bonder as in Example 1, and the base material was peeled, and the phosphor sheet was thermally cured at 150° C. for 30 minutes. The blue LED was cooled to room temperature, and then the base material was peeled, and consequently the phosphor sheet completely adhered to the blue LED, and the base material could be cleanly peeled off without leaving the phosphor sheet on the base material, and therefore an adhesive property was good. The surface electrode of the LED chip was subject to wire bonding, and consequently a part of bonding wire was brought into contact with the hole previously machined in the phosphor sheet since the hole size was small. Ten LED provided with a phosphor sheet and sealed with a resin after wire bonding were prepared, and each LED was connected to a DC power source to light up, but three of the 10 LEDs had defective connection and could not light up. The number of samples prepared was increased, and 10 LED light emitting devices with a phosphor sheet, normally lighting up, were obtained, and correlated color temperatures (CCT) of 10 samples were measured with a chromo illuminance meter (Konica Minolta CL200A), and a difference between the maximum value and the minimum value of the CCT was evaluated. Further, a thickness of the phosphor sheet was evaluated in the same manner as in Example 1, and the results were shown in Table 2.

Comparative Example 2

A phosphor-sheet was obtained in the same manner as in Example 1 by using the silicone resin 4 in place of the silicone resin 1. A hole of 200 μm in diameter was punched in the phosphor sheet in the same manner as in Example 1, and the phosphor sheet was singulated into a size of 1 mm square. Holing characteristics and cutting characteristics were good as with Example 1. The phosphor sheet cut into a size of 1 mm square was located in such a way that a phosphor sheet surface was in contact with a chip surface of a blue LED chip mounted on a substrate, and a hole of the phosphor sheet was aligned on a surface electrode of the LED chip by using a die bonder (manufactured by Toray Engineering Co., Ltd.), and the phosphor sheet was press-bonded for 1 minute from a base film side by a heating head heated to 100° C. The LED chip provided with the phosphor sheet was cooled to room temperature, and then the base film was peeled, and consequently the phosphor sheet incompletely adhered to the blue LED and peeled off from the LED element together with the base film, and therefore an evaluation of the LED element was impossible.

Comparative Example 3

A phosphor-sheet was obtained in the same manner as in Example 1 by using the silicone resin 4 in place of the silicone resin 1. The silicone resin 3 not containing a phosphor was applied onto the phosphor sheet by use of a slit die coater, heated at 120° C. for 10 minutes, and dried to obtain a laminate type phosphor sheet in which an adhesive layer having a thickness of 10 μm was formed on the phosphor sheet having a thickness of 90 μm.

Thereafter, a hole of 200 μm in diameter was punched in the phosphor sheet by using a die punching apparatus (manufactured by UHT CORPORATION). Diameters of 10 punched hole were investigated with a microscope equipped with a length measurement device to determine an average of the diameters, and consequently the average was slightly smaller than a design value as shown in Table 2, and an extrusion of the silicone resin 3 was partially found. Then, the resin sheet was singulated into 10000 pieces having a size of 1 mm square by using a cutting apparatus (GCUT manufactured by UHT CORPORATION), but about one third of these pieces was re-bonded and could not be cut off.

Using only phosphor sheets which could be singulated without any difficulty, the phosphor sheet was thermocompression bonded to a blue LED element at 100° C. for 10 seconds by using the same die bonder as in Example 1, and the base film was peeled, and the phosphor sheet was thermally cured at 150° C. for 30 minutes. The blue LED element provided with the phosphor sheet was cooled to room temperature, and then the base film was peeled, and consequently the phosphor sheet completely adhered to the blue LED, and the base film could be cleanly peeled off without leaving the phosphor sheet on the base film. The surface electrode of the LED chip was subjected to wire bonding, and consequently a wire was brought into contact with a silicone resin 3 since the silicone resin 3 partially extruded to a hole previously machined in the phosphor sheet. Ten blue LED provided with a phosphor sheet and sealed with a resin after wire bonding were prepared, and each LED was connected to a DC power source to light up, but two of the 10 LEDs had defective connection and could not light up. The number of samples prepared was increased, and 10 LED light emitting devices with a phosphor sheet, normally lighting up, were obtained, and correlated color temperatures (CCT) of 10 samples were measured with a chromo illuminance meter (Konica Minolta CL200A), and a difference between the maximum value and the minimum value of the CCT was evaluated. Further, a thickness of the phosphor sheet was evaluated in the same manner as in Example 1, and the results were shown in Table 2.

Comparative Example 4

Using a 300 ml polyethylene container, 90% by weight of the silicone resin 1 and 10% by weight of a phosphor "NYAG-02" (manufactured by Intematix Corporation: YAG-based phosphor doped with Ce, specific gravity: 4.8 g/cm³, D50: 7 μm) were mixed.

A predetermined amount of the resin including a phosphor was dispensed on a chip surface of a substrate on which a blue LED chip was mounted and wire bonding was applied by using a dispenser, and the resin including a phosphor was thermally cured at 150° C. for 1 hour. The 10 LEDs sealed with a phosphor-containing resin were prepared, and each LED was connected to a DC power source to light up, and consequently it was verified that all of 10 LEDs lit up. Correlated color temperatures (CCT) of all of 10 samples were measured with a chromo illuminance meter (Konica Minolta CL200A), and a difference between the maximum value and the minimum value of the CCT was taken as a color temperature variation and evaluated. The results were shown in Table 2. In addition, since the dispensed phosphor-containing resin was configured into a dome-shape, a difference between the thickness at a center and the thickness at a middle point between the center and an end was very large.

TABLE 1

|  | 25° C. | 100° C. | 140° C. |
| --- | --- | --- | --- |
| silicone 1 | 1.0 MPa | 0.025 MPa | 0.038 MPa |
| silicone 2 | 6 MPa | 0.0035 MPa | 0.0020 MPA |
| silicone 3 | 0.005 MPa | 0.006 MPa | 0.007 MPa |
| silicone 4 | 1.1 MPa | 0.35 MPa | 0.29 MPa |

TABLE 2

|  |  |  | Example 1 | Example 2 | Example 3 | Example 4 | Comparative Example 1 | Comparative Example 2 | Comparative Example 3 | Comparative Example 4 |
| --- | --- | --- | --- | --- | --- | --- | --- | --- | --- | --- |
| First Layer | Binder Resin | Type | silicone 1 | silicone 2 | silicone 1 | silicone 1 | silicone 3 | silicone 4 | silicone 4 | silicone 1 |
|  |  | Parts by Weight | 30 | 30 | 30 | 30 | 30 | 30 | 30 | 90 |
|  | Phosphor | Type | NYAG-02 | NYAG-02 | NYAG-02 | NYAG-02 | NYAG-02 | NYAG-02 | NYAG-02 | NYAG-02 |
|  |  | Parts by Weight | 70 | 70 | 70 | 70 | 70 | 70 | 70 | 10 |
|  | Thickness | μm | 90 | 90 | 90 | 90 | 90 | 90 | 90 | Dome-shaped |
| Second Layer | Binder Resin | Type | — | — | — | — | — | — | silicone 3 | — |
|  |  | Parts by Weight | — | — | — | — | — | — | 100 | — |
|  | Phosphor | Type | — | — | — | — | — | — | — | — |
|  |  | Parts by Weight | — | — | — | — | — | — | — | — |
|  | Thickness | μm | — | — | — | — | — | — | 10 | — |
| 200 μm holing characteristics | Average Diameter | μm | 195 | 198 | 195 | 197 | 160 | 195 | 180 | — |
| Cutting Characteristics | Number of Pieces Normally Cut in 100 Pieces |  | 98 | 100 | 100 | 100 | 46 | 100 | 68 | — |
| Adhesive Property | Bonding to LED Chip |  | good | good | good | good | good | not adhere | good | — |
| LED Lighting Test | Number of LEDs Lighted in 10 LEDs |  | 10 | 10 | 10 | 10 | 7 | out of evaluation | 8 | 10 |
|  | Color Temperature Variation (K.) |  | 68 | 55 | 70 | 65 | 101 | out of evaluation | 99 | 210 |
| Difference between Thickness at Center of LED Element and Thickness at Middle Point between Center and End of LED Element (ratio by % relative to thickness at center) 10 Sample Average | Variation (%) |  | 3.8 | −2.5 | 4.6 | −4.7 | −13.2 | out of evaluation | 8.9 | −28.2 |

Thereafter, the resulting mixture was stirred and deaerated at 1000 rpm for 20 minutes by using a planetary mixer/deaerator "MAZERUSTAR KK-400" (manufactured by KURABO INDUSTRIES LTD.) to obtain a silicone resin including a phosphor dispersed for dispensing.

DESCRIPTION OF REFERENCE SIGNS 1 phosphor sheet
2 base material
3 temporary fixing sheet
4 LED element 5 mounting substrate
6 thermocompression bonding tool
7 wafer provided with LED element on surface thereof.

The invention claimed is:

1. A phosphor-containing sheet having a storage modulus of 0.1 MPa or more at 25° C. and a storage modulus of less than 0.1 MPa at 100° C., wherein a resin main, component of the phosphor-containing sheet is a crosslinked product formed by subjecting a crosslinkable silicone composition containing at least the following compositions (A) to (D) to a hydrosilylation reaction;

(A) organopolysiloxane represented by an average unit formula:

$$(R^1_2SiO_{2/2})_a(R^1SiO_{3/2})_b(R^2O_{1/2})_c$$

in which $R^1$ is a phenyl group, an alkyl group or a cycloalkyl group having 1 to 6 carbon atoms, or an alkenyl group having 2 to 6 carbon atoms, provided that 65 to 75 mol % of $R^1$ is phenyl and 10 to 20 mol % of $R^1$ is an alkenyl group, $R^2$ is a hydrogen atom or an alkyl group having 1 to 6 carbon atoms, and a, b and c satisfy the relationship of $0.5 \le a \le 0.6$, $0.4 \le b \le 0.5$, $0 \le c \le 0.1$ and $a+b=1$;

(B) organopolysiloxane, 5 to 15 parts by weight with respect to 100 parts by weight of the component (A), represented by the general formula:

$$R^3_3SiO(R^3_2SiO)_mSiR^3_3$$

in which $R^3$ is a phenyl group, an alkyl group or a cycloalkyl group having 1 to 6 carbon atoms, or an alkenyl group having 2 to 6 carbon atoms, provided that 40 to 70 mol % of $R^3$ is phenyl and at least one of $R^3$'s is an alkenyl group, and m is an integer of 5 to 50;

(C) organotrisiloxane, in such an amount that a molar ratio of a hydrogen atom coupled with a silicon atom in this component to the total of the alkenyl group in the component (A) and the component (B) is 0.5 to 2, represented by the general formula:

$$(HR^4_2SiO)_2SiR^4_2$$

in which $R^4$ is a phenyl group, or an alkyl group or a cycloalkyl group having 1 to 6 carbon atoms, provided that 30 to 70 mol % of $R^4$ is phenyl; and (D) a catalyst for a hydrosilylation reaction, in such an amount sufficient to promote a hydrosilylation reaction of the alkenyl groups in the component (A) and the component (B) with the hydrogen atom coupled with a silicon atom in the component (C).

2. The phosphor-containing sheet according to claim 1, wherein a phosphor content is 53% by weight or more.

3. The phosphor-containing sheet according to claim 1, which is used as a wavelength conversion layer of an LED element.

4. The phosphor-containing sheet according to claim 1, provided with a through-hole.

5. A laminate in which the phosphor-containing sheet according to claim 1 is laminated on a semiconductor wafer provided with an LED element thereon.

6. A light emitting device obtained by using the phosphor-containing sheet according to claim 1, wherein a phosphor-containing layer having a thickness of 10 to 1000 μm, in which a difference between the thickness at a center and the thickness at a middle point of a line segment drawn from the center to an arbitrary point at an end of the emission surface is within a range of the thickness at said center plus or minus 5%, is disposed on an LED element.

7. A method for manufacturing a light emitting device comprising at least the step of bonding the phosphor-containing sheet according to claim 1 to an emission surface of an LED element by heating.

8. The method for manufacturing a light emitting device according to claim 7, wherein a temperature at which said phosphor-containing sheet is bonded to said emission surface of an LED element is 60° C. or more and 250° C. or less.

9. The method for manufacturing a light emitting device according to claim 7, further comprising the step of cutting the phosphor-containing sheet according to claim 1 into singulated pieces, wherein said step of bonding said phosphor-containing sheet to said emission surface of an LED element by heating is a step of bonding said phosphor-containing sheet cut into singulated pieces to an LED element by heating.

10. The method for manufacturing a light emitting device according to claim 7, wherein said step of bonding said phosphor-containing sheet to said emission surface of an LED element by heating is a step of bonding said phosphor-containing sheet to a plurality of LED elements collectively by heating, further comprising the step of performing cutting of said phosphor-containing sheet and dicing of said LED element collectively.

11. The method for manufacturing a light emitting device according to claim 7, wherein the phosphor-containing sheet according to claim 1 is subjected to holing before being bonded to an LED element.

* * * * *